US012573996B2

(12) United States Patent
Gao et al.

(10) Patent No.: US 12,573,996 B2
(45) Date of Patent: Mar. 10, 2026

(54) RESISTOR-CAPACITOR CALIBRATION METHOD AND RESISTOR-CAPACITOR CALIBRATION CIRCUIT

(71) Applicant: REALTEK SEMICONDUCTOR CORP., Hsinchu (TW)

(72) Inventors: Ruo-Hsuan Gao, Hsinchu (TW); Chia-Jun Chang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 10 days.

(21) Appl. No.: 18/637,524

(22) Filed: Apr. 17, 2024

(65) Prior Publication Data

US 2024/0356513 A1      Oct. 24, 2024

(30) Foreign Application Priority Data

Apr. 19, 2023    (TW) ................................. 112114484

(51) Int. Cl.
H03H 7/00      (2006.01)
H03H 7/01      (2006.01)

(52) U.S. Cl.
CPC ..... H03H 7/0153 (2013.01); H03H 2210/043 (2013.01)

(58) Field of Classification Search
CPC ............... H03H 7/0107; H03H 7/0153; H03H 11/1204; H03H 11/0405; H03H 11/0472; H03H 11/1291; H03H 11/04; H03H 2210/00; H03H 21/00
See application file for complete search history.

(56) References Cited

U.S. PATENT DOCUMENTS

| | | | | |
|---|---|---|---|---|
| 6,262,603 B1* | 7/2001 | Mohan | ................. | H03H 7/0153 |
| | | | | 327/518 |
| 6,803,813 B1* | 10/2004 | Pham | ................. | H03H 11/1291 |
| | | | | 327/553 |
| 9,584,132 B2* | 2/2017 | Kim | .......................... | H03L 1/02 |
| 10,498,308 B2* | 12/2019 | Ek | ........................ | G01R 35/005 |
| 11,764,728 B1* | 9/2023 | Liu | ...................... | H03K 3/0231 |
| | | | | 327/291 |
| 2013/0033307 A1* | 2/2013 | Lin | .................... | H03H 11/0472 |
| | | | | 327/553 |

(Continued)

*Primary Examiner* — Tuan T Lam

(74) *Attorney, Agent, or Firm* — Li & Cai Intellectual Property (USA) Office

(57) ABSTRACT

An RC calibration method and an RC calibration circuit are provided. The method includes: providing an RC calibration circuit; calculating a ratio of an input period of an input clock signal to an initial period, and configuring the processing circuit to perform a calibration process including: adjusting a first current source, a second current source, and/or an adjustment factor of the input period according to the ratio, so as to satisfy a specified RC product, or adjusting a resistance and/or a capacitance of the specified RC product; controlling the first current source to charge a to-be-calibrated capacitor; and determining whether a comparison signal indicates that first and second voltages meet a calibration completion condition, and if not, adjusting the to-be-calibrated resistor and/or the to-be-calibrated capacitor until the comparison signal indicates that the first and second voltages meet the calibration completion condition.

16 Claims, 5 Drawing Sheets

(56) References Cited

U.S. PATENT DOCUMENTS

| | | | |
|---|---|---|---|
| 2013/0082720 A1* | 4/2013 | Tang ........................ | H03J 1/005 |
| | | | 324/135 |
| 2013/0207693 A1* | 8/2013 | Kao ................. | H03K 19/00369 |
| | | | 327/87 |
| 2017/0040944 A1* | 2/2017 | Satoh ........................ | H03B 5/24 |
| 2018/0145665 A1* | 5/2018 | Hurwitz .................. | H03B 1/00 |
| 2024/0364357 A1* | 10/2024 | Jain ........................ | H03K 3/0231 |

* cited by examiner

RESISTOR-CAPACITOR CALIBRATION METHOD AND RESISTOR-CAPACITOR CALIBRATION CIRCUIT

CROSS-REFERENCE TO RELATED PATENT APPLICATION

This application claims the benefit of priority to Taiwan Patent Application No. 112114484, filed on Apr. 19, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a calibration method and a calibration circuit, and more particularly to a resistor-capacitor (RC) calibration method and an RC calibration circuit.

BACKGROUND OF THE DISCLOSURE

Radio frequency (RF) transceivers usually contain filters for filtering out unwanted signals, and a product of a resistance (R) and a capacitance (C) (hereinafter referred to as RC value) in the filter determines a corner frequency thereof. Since the RC value varies along with variations in process and temperature, the RC value may be calibrated through the existing RC calibration circuit to ensure that the corner frequency of the filter complies with a design specification.

In the existing RC calibration circuit, the calibration is performed for a specific cycle, charge times (i.e., the number of times that the capacitor is charged) and current. During the calibration, the capacitor can be charged by controlling a value of the capacitance. When an output state of a comparator circuit changes, a set value of the capacitance can be obtained for calibrating the RC value to an expected RC value.

However, when a clock signal used by the RC calibration circuit changes, the RC calibration circuit needs to be redesigned, resulting in increased hardware costs.

SUMMARY OF THE DISCLOSURE

In response to the above-referenced technical inadequacies, in one aspect, the present disclosure provides a resistor-capacitor (RC) calibration method applicable to a to-be-calibrated resistor and a to-be-calibrated capacitor, and the RC calibration method includes providing an RC calibration circuit, which includes a first current source, a second current source, a comparator circuit and a processing circuit. The first current source is electrically coupled to the to-be-calibrated resistor through a first node, and the to-be-calibrated resistor is grounded. The second current source is electrically coupled to the to-be-calibrated capacitor through a second node, and the to-be-calibrated capacitor is grounded. The comparator circuit is configured to compare a first voltage of the first node with a second voltage of the second node, and to correspondingly generate a comparison signal according to a comparison result. The processing circuit is configured to receive an input clock signal and the comparison signal. The RC calibration method further includes: configuring the processing circuit to perform a calibration process according to a ratio of an input period of the input clock signal to an initial period, wherein the calibration process includes: adjusting one or more of a first current of the first current source, a second current of the second current source, and an adjustment magnification of the input period according to the ratio to satisfy an equation for a specified resistance-capacitance product, or adjusting one or more of a resistance and a capacitance in the specified resistance-capacitance product according to the ratio, in which the initial period is associated with the specified resistance-capacitance product; configuring the processing circuit to control the second current source to charge the to-be-calibrated capacitor; and configuring the processing circuit to determine whether or not the comparison signal indicates that the first voltage and the second voltage meet a calibration completion condition, and if not, adjusting one or more of the to-be-calibrated resistor and the to-be-calibrated capacitor according to the comparison signal, and repeatedly controlling the second current source to charge the to-be-calibrated capacitor until the comparison signal indicates that the first voltage and the second voltage meet the calibration completion condition.

In another aspect, the present disclosure provides an RC calibration circuit applicable to a to-be-calibrated resistor and a to-be-calibrated capacitor, and the RC calibration circuit includes a first current source, a second current source, a comparator circuit and a processing circuit. The first current source is electrically coupled to the to-be-calibrated resistor through a first node. The second current source is electrically coupled to the to-be-calibrated capacitor through a second node. The comparator circuit is configured to compare a first voltage of the first node with a second voltage of the second node, and to generate a comparison signal according to a comparison result. The processing circuit is configured to receive an input clock signal and the comparison signal, and perform a calibration process, including: adjusting, according to a ratio between an input period of the input clock signal and an initial period, one or more of a first current of the first current source, a second current of the second current source, and an adjustment magnification of the input period in order to satisfy an equation for a specified resistance-capacitance product, or adjusting one or more of a resistance and a capacitance in the specified resistance-capacitance product according to the ratio, in which the initial period is associated with the specified resistance-capacitance product; determining whether or not the comparison signal indicates that the first voltage and the second voltage meet a calibration completion condition, and if not, adjusting one or more of the to-be-calibrated resistor and the to-be-calibrated capacitor according to the comparison signal, and repeatedly controlling the second current source to charge the to-be-calibrated capacitor until the comparison signal indicates that the first voltage and the second voltage meet the calibration completion condition.

Therefore, in the RC calibration method and the RC calibration circuit provided by the present disclosure, the first current source, the second current source, the adjustment magnification of the input clock and the adjusted charging number of times used for charging can be dynamically adjusted, or the to-be-calibrated resistor and/or to-becalibrated capacitor can be adjusted, such that the RC calibration method and the RC calibration circuit provided by the present disclosure can be applied to circuits with clock signals different from an initial period used in the initial design that specifies the resistance-capacitance product, and there is no need to redesign the RC calibration circuit, such as to save hardware costs.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
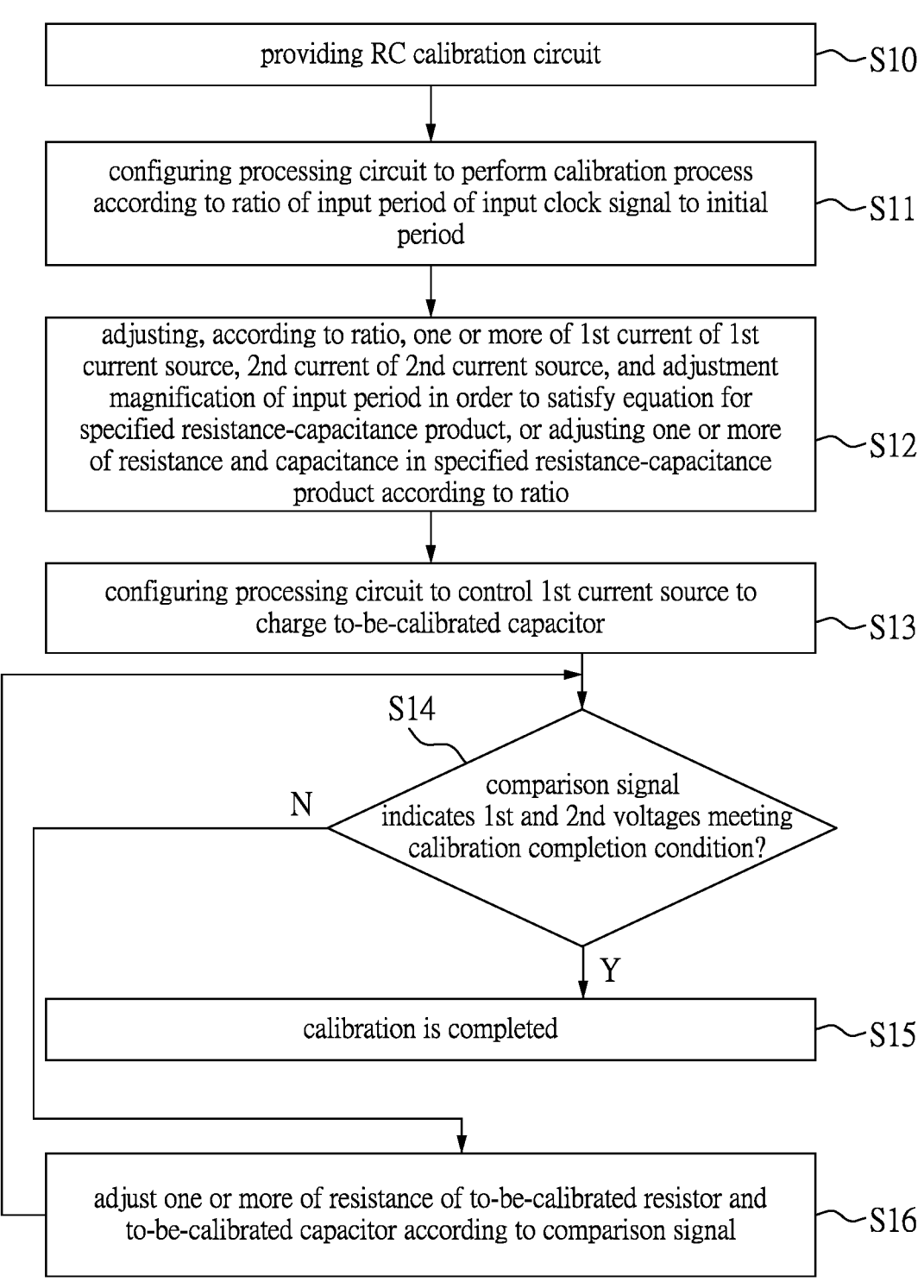
FIG. 1 is a flowchart of an RC calibration method according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

FIG. 1 is a flowchart of an RC calibration method according to one embodiment of the present disclosure. Referring to FIG. 1, one embodiment of the present disclosure provides a resistor-capacitor calibration method, which is applicable to a to-be-calibrated resistor and a to-be-calibrated capacitor, and any to-be-calibrated RC circuits. For example, for any circuit that needs a high-accuracy RC value, the RC value of such circuit can be calibrated by the RC calibration method (circuit) provided by the present disclosure. The following is an example of a filter. The filter is usually included in a radio frequency (RF) transceiver to filter signals. The filter can be, for example, one or more order RC filters, and a product of a resistance (R) and a capacitance (C) in the filter (hereinafter referred to as an RC value) determines a corner frequency. Since the RC value varies with variations in process and temperature, the RC value needs to be calibrated to ensure that the corner frequency of the filter complies with design specifications.

As shown in FIG. 1, the RC calibration method includes the following steps:

Step S10: providing an RC calibration circuit.

Figure 2:
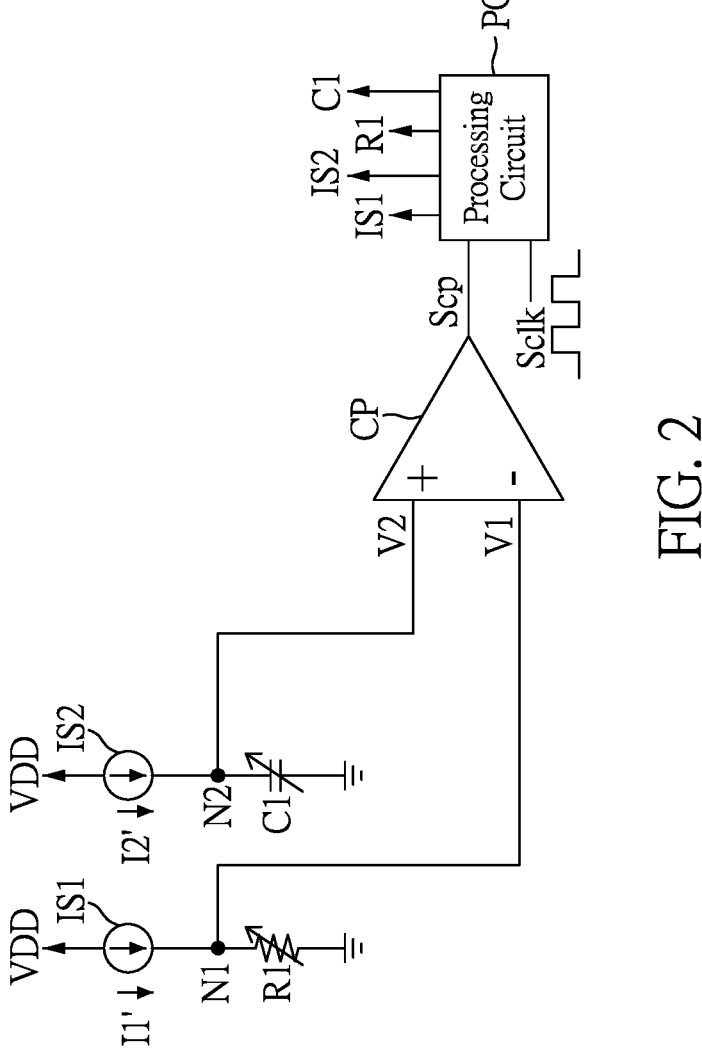
FIG. 2 is a first schematic circuit diagram of an RC calibration circuit according to one embodiment of the present disclosure.

FIG. 2 is a first schematic circuit diagram of an RC calibration circuit according to one embodiment of the present disclosure. Referring to FIG. 2, in one embodiment of the present disclosure, the to-be-calibrated filter can include a to-be-calibrated resistor R1 and a to-be-calibrated capacitor C1. In order to retain correctable characteristics, the to-be-calibrated resistor R1 can be a variable resistor circuit, and the to-be-calibrated capacitor C1 can be a variable capacitor circuit. In some embodiments, adjustment of the resistor and the capacitor can be implemented by electrically coupling them in parallel and configuring switches. For example, the to-be-calibrated capacitor C1 can include a plurality of capacitors electrically coupled in parallel, with one end of each capacitor being electrically coupled to a corresponding switch. For example, given that the to-be-calibrated capacitor C1 includes a first capacitor, a second capacitor and a third capacitor having capacitance values of 0.6 pF, 0.2 pF and 0.1 pF, respectively, and that the to-be-calibrated capacitor C1 has a capacitance that is an equivalent capacitance of the three capacitors electrically coupled in parallel, when the switch corresponding to the first capacitor is turned on, and the switches corresponding to the second capacitor and the third capacitor are turned off, the capacitance of the to-be-calibrated capacitor C1 is 0.6 pF. Similarly, when the switches corresponding to the first capacitor and the second capacitor are turned on, and the switch corresponding to the third capacitor is turned off, the capacitance of the to-be-calibrated capacitor C1 is 0.8 pF. Therefore, the switch corresponding to each capacitor can be controlled by the processor or the controller, such that the capacitance of the to-be-calibrated capacitor C1 can be similarly adjusted. However, both the variable resistance circuit and the variable capacitance circuit are known to those skilled in the art and have multiple conceivable implementations, so that details thereof will not be repeated herein.

As shown in FIG. 2, the RC calibration circuit 1 of the embodiment of the present disclosure includes a first current source IS1, a second current source IS2, a comparator circuit CP and a processing circuit PC. Both the first current source IS1 and the second current source IS2 are electrically coupled to a common voltage source VDD, the first current source IS1 is electrically coupled to the to-be-calibrated resistor R1 through a first node N1, and the to-be-calibrated resistor R1 is grounded. On the other hand, the second current source IS2 is electrically coupled to the to-be-calibrated capacitor C1 through a second node N2, and the to-be-calibrated capacitor C1 is grounded.

The comparator circuit CP is configured to compare a first voltage V1 of the first node N1 with a second voltage V2 of the second node N2, and correspondingly generate a comparison signal Scp according to a comparison result. The processing circuit PC can receive an input clock signal Sclk and the comparison signal Scp. It should be noted that the processing circuit PC can be, for example, a digital logic control circuit, which can be used to control magnitude of the first current source IS1 and the second current source IS2, and control the second current source IS2 to charge the to-be-calibrated capacitor C1 at a specified charging time (and a specified charging number of times). The processing circuit PC can be further configured to control a resistance of the to-be-calibrated resistor R1 and a capacitance of the to-be-calibrated capacitor C1.

Step S11: configuring the processing circuit to perform a calibration process according to a ratio of an input period of the input clock signal to an initial period.

It should be noted that the ratio of the input period of the input clock signal to the initial period is predetermined. In the RC calibration method of the embodiment of the present disclosure, the RC calibration circuit that can be dynamically adjusted is designed for applying the RC calibration method on circuits with different periods of clock signals. For example, assuming that the initial period of the originally designed clock signal is T, the first current source IS1 has a first initial current I1, the second current source IS2 has a second initial current I2, and the processing circuit PC controls the second current source IS2 to charge the to-be-calibrated capacitor C1 for an initial charging number of times, which is N. Based on the architecture in FIG. 2, a specified resistance-capacitance product can be obtained as shown in the following equation (1)-(3):

$$V1 = I1 * R; \qquad \text{equation (1)}$$

$$V2 = N * T * I2/C; \qquad \text{equation (2)}$$

$$RC = N * T * I2/I1; \qquad \text{equation (3)}$$

where RC in equation (3) is the specified resistance-capacitance product, which is associated with the initial period T.

Therefore, further assuming that an initial frequency of the clock signal in an original design is 40 MHz, when the input frequency of the input clock signal Sclk input to the processing circuit PC is changed to 60 MHz, the ratio of the input period T' to the initial period T can be obtained as 2/3, that is, the input period T' is 2/3 times of the initial period T.

Step S12: adjusting one or more of the first current of the first current source, the second current of the second current source, and an adjustment magnification of the input period according to the ratio to satisfy an equation for the specified resistance-capacitance product, or adjusting one or more of a resistance and a capacitance in the specified resistance-capacitance product according to the ratio.

This step can be performed, for example, according to the above equation (3) and the following equation (4):

$$RC = N * T' * K * I2'/I1'; \qquad \text{equation (4)}$$

where RC is the specified resistance-capacitance product, T' is the input period, I1' is the first current, I2' is the second current, and K is the adjustment magnification of the input period T'.

In continuation of the above example, when the input period T' is obtained as 2/3 times the initial period T, the specified resistance-capacitance product can be further obtained according to the following equation (5):

$$RC = N * T' * (I2/I1) * (3/2). \qquad \text{equation (5)}$$

It can be seen from equation (5) that if T'*(I2/I1) is multiplied by 3/2, the specified resistance-capacitance product of the original design can be obtained. T'*(I2/I1)*(3/2) can be obtained through the following methods (1) to (3):

Method (1): adjusting the first current I1' and the second current I2';

Method (2): adjusting the first current I1', and adjusting the input period T' by adjusting the magnification K; and Method (3): adjusting the first current I1' and the second current I2', and adjusting the input period T' by adjusting the magnification K.

For method (1), the architecture of FIG. 2 can be directly used, and the processing circuit PC can be configured to control the first current source IS1 and the second current source IS2 respectively, such as to make the first current I1' twice the first initial current I1, and the equation (5) can be met by making the second current I2' three times of the second initial current I2.

Figure 3:
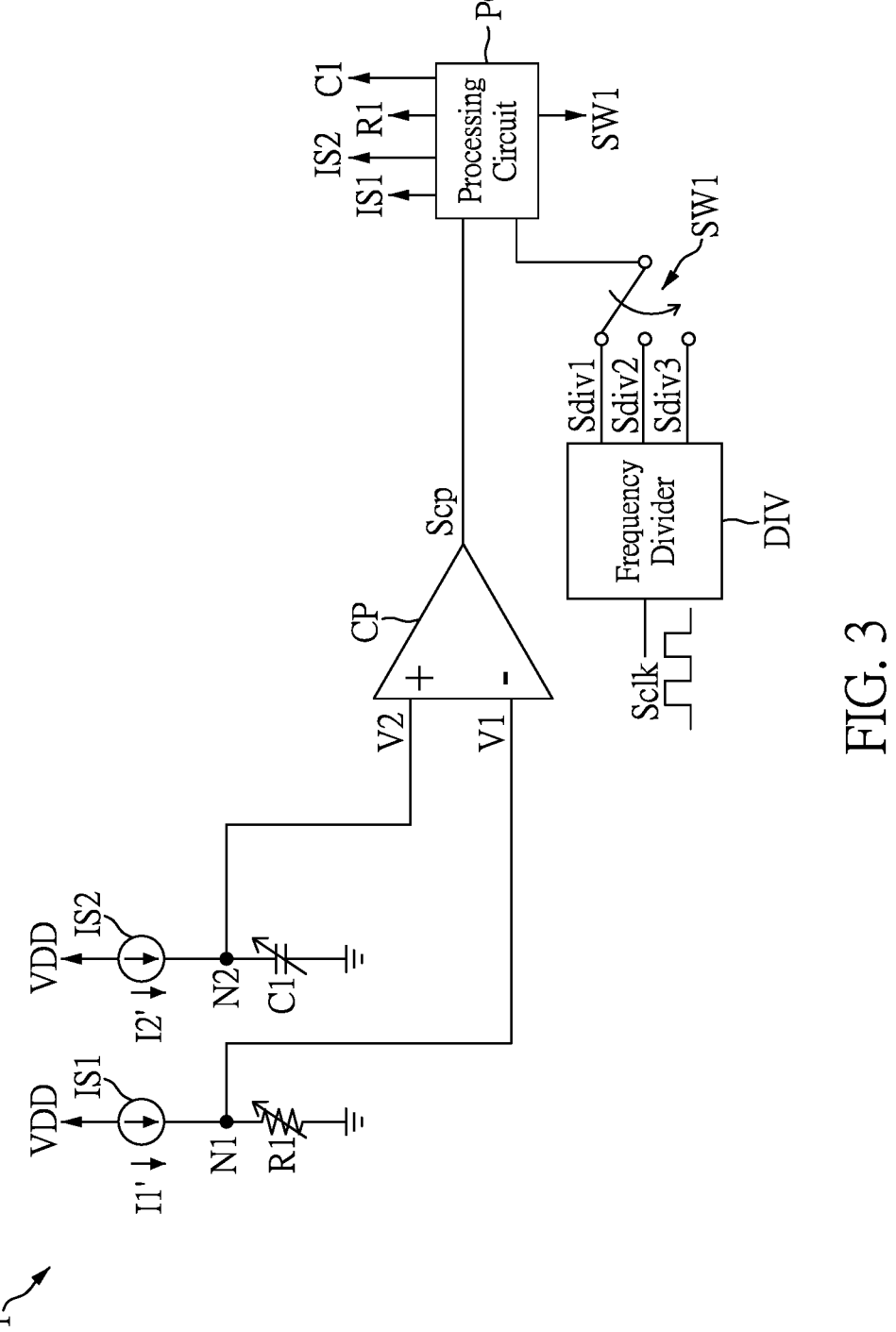
FIG. 3 is a second schematic circuit diagram of the RC calibration circuit according to one embodiment of the present disclosure.

For methods (2) and (3), the architecture of FIG. 3 is needed. Reference is made to FIG. 3, which is a second schematic circuit diagram of the RC calibration circuit according to one embodiment of the present disclosure.

As shown in FIG. 3, the RC calibration circuit 1 further includes a frequency divider DIV and a switch circuit SW1. The frequency divider DIV can be configured to receive the input clock signal Sclk through an input terminal thereof, and the frequency divider DIV has a plurality of output terminals for outputting frequency divided signals, such as frequency divided signals Sdiv1, Sdiv2 and Sdiv3.

The switch circuit SW1 is electrically coupled between the frequency divider DIV and the processing circuit PC, and can be, for example, a single-pole multi-throw switch, which is controlled to selectively select one of the frequency-dividing signals (such as the frequency-dividing signals Sdiv1, Sdiv2, and Sdiv3) to input to the processing circuit PC.

Therefore, for method (2), the frequency division signal divided by 3 in the frequency divider DIV can be selected through the switch circuit SW1, such that the input period T' becomes 3 times of the initial period T (that is, K=3), and the first current I1' is twice of the first initial current I1, thus satisfying equation (5) under the same charging number of times N, and allowing the specified resistance-capacitance product of the original design to be successfully obtained.

Method (3) can be used to deal with more complex ratios. For example, in a non-simple 2/3 condition, the first current I1', the second current I2' and the adjustment magnification K can be adjusted to satisfy equation (5), and repetitive descriptions are omitted herefrom.

In the above examples, the equation for the specified resistance-capacitance product can be satisfied by adjusting one or more of the first current I1', the second current I2', and the adjustment magnification K, but the present disclosure is not limited thereto. The following further explains how the specified resistance-capacitance product can be satisfied by adjusting one or more of the first current I1', the second current I2', and an adjusted charging number of times N'.

In this step, the adjustment can be performed, for example, according to the above equation (3) and the following equation (6):

$$RC = N' * T' * K * I2'/I1';$$    equation (6)

where RC is the specified resistance-capacitance product, T' is the input period, I1' is the first current, I2' is the second current, and K is the adjustment magnification.

Figure 4:
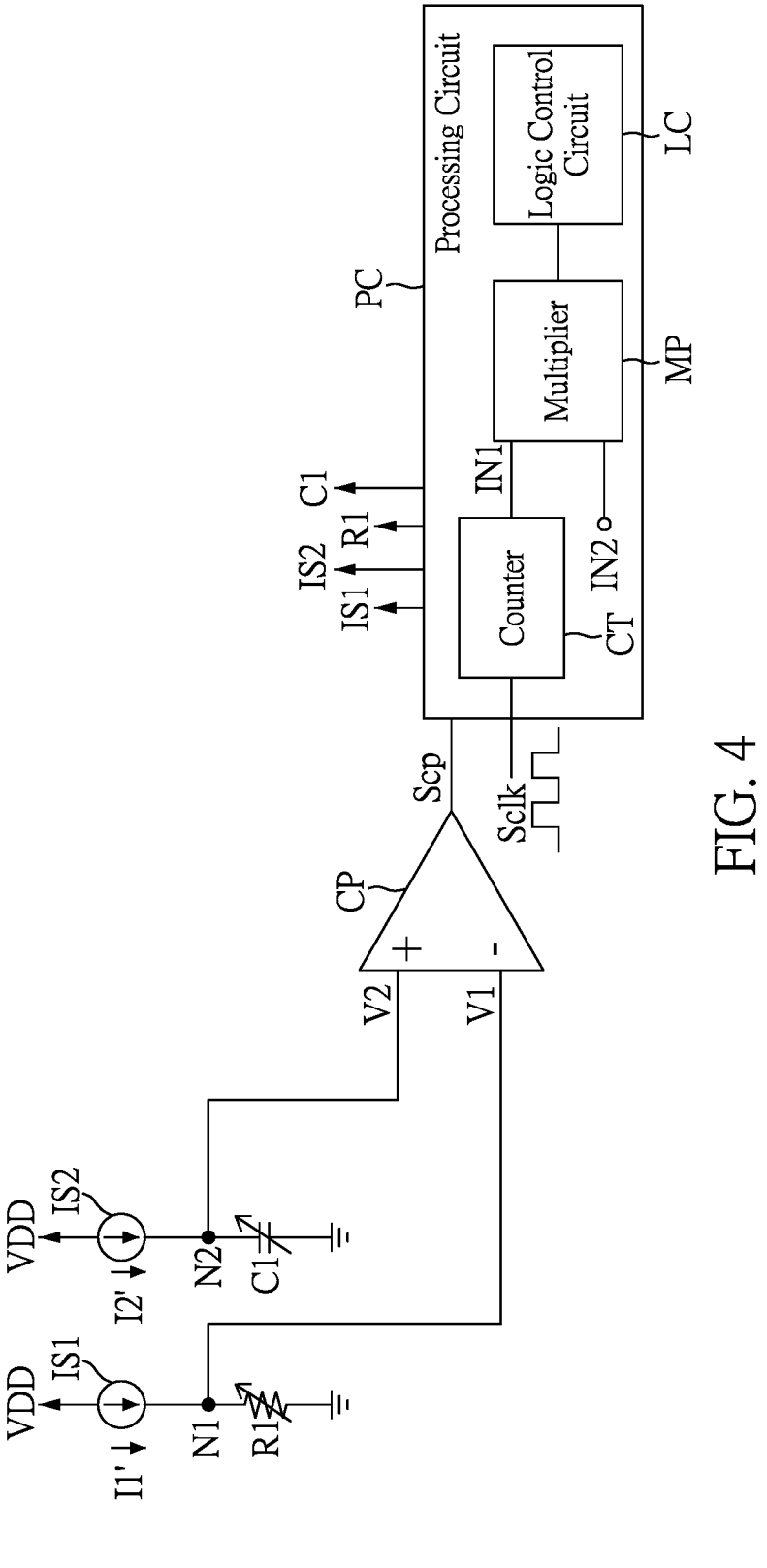
FIG. 4 is a third schematic circuit diagram of the RC calibration circuit according to one embodiment of the present disclosure.

Reference is made to FIG. 4, which is a third schematic circuit diagram of the RC calibration circuit according to one embodiment of the present disclosure.

As shown in FIG. 4, the processing circuit PC further includes a counter CT and a multiplier MP, and a logic control circuit LC for implementing the aforementioned and following functions. The counter CT can be configured to receive the input clock signal Sclk, and count the input clock signal Sclk to generate a count value. For example, an initial count value is 0, and whenever the input clock signal Sclk has a rising edge, the count value is increased by 1, but this is merely an example and is not meant to limit the present disclosure. A first input terminal IN1 of the multiplier MP can be electrically coupled to the counter CT for receiving the count value, and a second input terminal IN2 of the multiplier MP is used for receiving another input value. The multiplier MP is configured to multiply the count value and the input value as the adjusted charging number of times N', which is then output to the logic control circuit LC. The logic control circuit LC can control the second current source IS2 to charge the to-be-calibrated capacitor C1 according to the adjusted charging number of times N'.

Continuing the above example below, when the input period T' is 2/3 times the initial period T, the specified resistance-capacitance product can be further obtained as shown in the following equation (7):

$$RC = N' * T' * (I2/I1) * (3/2);$$    equation (7)

It can be seen from equation (7) that if N'*T'*(I2/I1) is multiplied by (3/2), the specified resistance-capacitance product of the original design can be obtained. N'*T'*(I2/I1)*(3/2) can be obtained by the following methods (4) and (5):

Method (4): adjusting the first current I1' and the adjusted charging number of times N'; and Method (5): adjusting the first current I1', the second current I2' and adjusting the charging number of times N'.

Therefore, for method (4), the input value representing 3 can be input from the second input terminal IN2 of the multiplier MP, for example, 11 (taking binary as an example). The multiplier MP multiplies the count value of the first input terminal IN1 by the input value of the second output terminal IN2 to make the charging number of times N' to be 3 times of the initial charging times N, and control the first current I1' to be twice the first initial current I1, equation (7) can then be met.

Method (5) can be used to deal with more complex ratios, for example, in a non-simple 2/3 situation, by adjusting the first current I1', the second current I2' and the adjusted charging number of times N' to meet equation (7), and repetitive descriptions are omitted.

In addition to the above methods (1) to (5), in other embodiments, the equation can also be established through method (6): adjusting the resistance or capacitance in the specified resistance-capacitance product. For example, assuming that the initial frequency of the clock signal in the original design is 40 MHz, when the input frequency of the input clock signal Sclk input to the processing circuit PC is changed to 60 MHz, the resistance of the to-be-calibrated resistor R1 and/or the capacitance of the to-be-calibrated capacitor C1 can be adaptively adjusted to meet equation (7). When the input frequency of the input clock signal Sclk is changed to 60 MHz, the period becomes smaller, and the resistance of the to-be-calibrated resistor R1 and/or capacitance of the to-be-calibrated capacitor C1 need to be reduced to meet equation (7). In the original design, a total charging time is a product of the initial charging number of times N and the initial cycle T, however, since the cycle becomes smaller, the total charging time becomes shorter, so it is necessary to reduce the specified resistance-capacitance product to make a charging speed faster. The adjustment of the specified resistance-capacitance product can be accomplished by adjusting one or more of the resistance of the to-be-calibrated resistor R1 and the capacitance of the to-be-calibrated capacitor C1.

Therefore, after adjustments are made according to methods (1) to (6), the RC calibration method proceeds to step S13: configuring the processing circuit to control the first current source to charge the to-be-calibrated capacitor. The charging time is determined according to conditions in the foregoing methods (1) to (6), which will not be repeated here.

Step S14: determining whether or not the comparison signal indicates that the first voltage and the second voltage meet a calibration completion condition. It should be noted that, ideally, the calibration completion condition is that the first voltage V1 and the second voltage V2 are the same, but in fact, the comparison signal Scp can only be used to find a time point at which the first voltage V1 and the second voltage V2 are close to each other, and may not accurately confirm that the first voltage V1 is the same as the second voltage V2. As a further example, when the first voltage V1 is greater than the second voltage V2, the comparator circuit CP determines to output 1 (that is, the comparison signal Scp is at a high level). When the values of R and C are adjusted to make the first voltage V1 to be lower than the second voltage V2 and an output of the comparator circuit changes to 0 (that is, the comparison signal Scp is at a low level), or when the output state of the comparator circuit CP changes from 0 to 1, approximate values of R and C when a state of the comparator circuit CP changes can be obtained.

This step is designed according to equations (1) to (3), when the comparison signal Scp indicates that the first voltage V1 is the same or approximate to the second voltage V2, that is, a difference between the first voltage V1 and the second voltage V2 is within a predetermined range, then the method proceeds to step S15, which means that the calibration is completed, and the product of the resistance of the to-be-calibrated resistor R1 and the capacitance of the to-be-calibrated capacitor C1 is the same as the specified resistor-capacitance product. This ensures that the corner frequency of the filter complies with the designer's plan.

If the comparison signal Scp indicates that the first voltage V1 is different from the second voltage V2, then the method proceeds to step S16 to adjust one or more of the resistance of the to-be-calibrated resistor R1 and the to-be-calibrated capacitor C1 according to the comparison signal Scp. The method than returns to step S13 to repeatedly control the second current source IS2 to charge the to-be-calibrated capacitor C1 until the comparison signal Scp indicates that the first voltage V1 and the second voltage V2 are approximate, which means that the calibration is complete.

Figure 5:
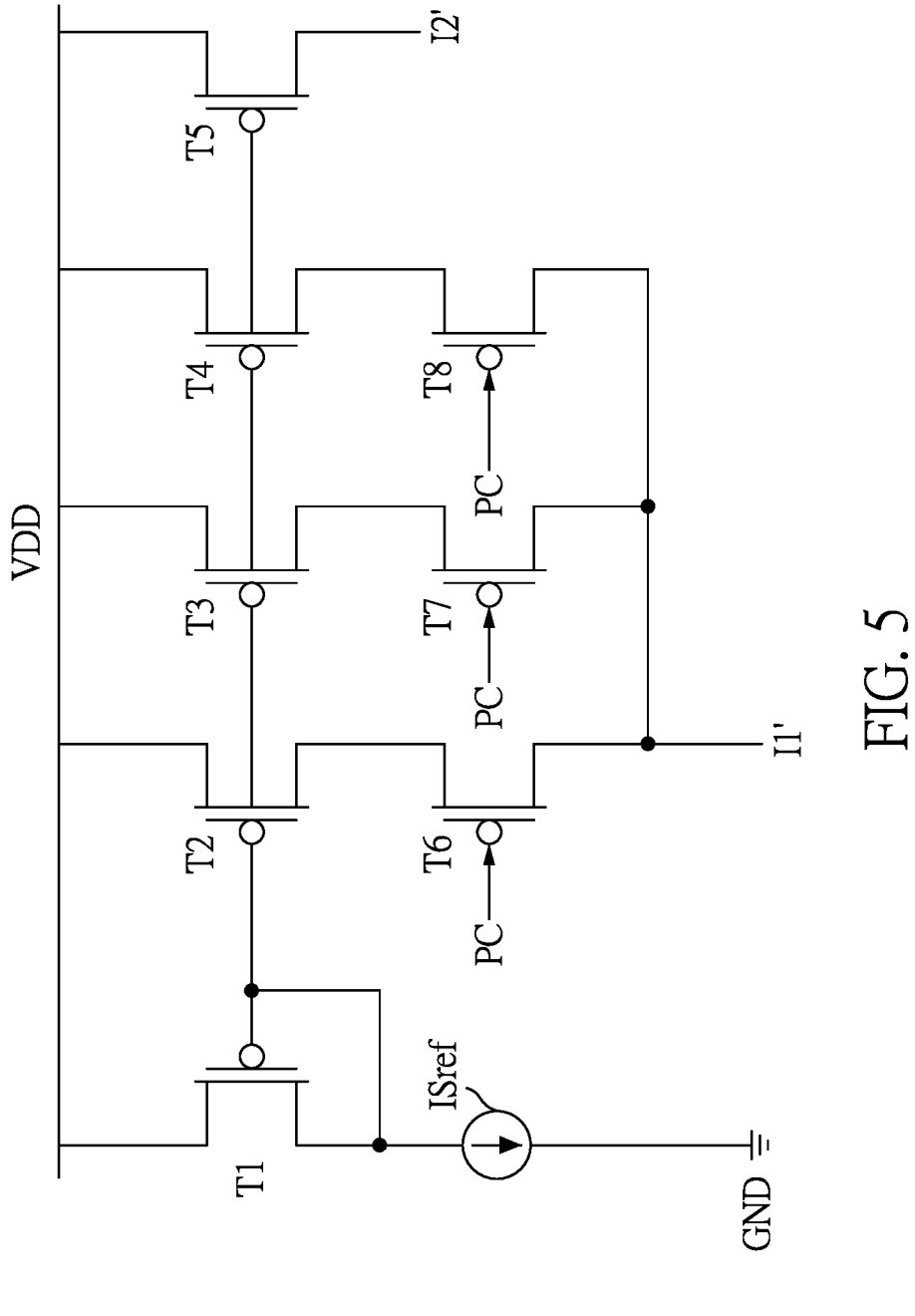
FIG. 5 is a schematic circuit diagram of a first current source and a second current source according to one embodiment of the present disclosure.

Reference is made to FIG. 5, which is a schematic circuit diagram of a first current source and a second current source according to one embodiment of the present disclosure. As shown in FIG. 5, in the above embodiments of the present disclosure, the first current source and the second current source can be implemented by an adjustable current source architecture 2. For example, the adjustable current source architecture 2 can include a reference current source ISref and a plurality of transistors T1 to T8. First terminals of the transistors T1 to T5 are electrically coupled to the common voltage source VDD, and second terminals of the transistors T1 to T5 are electrically coupled to each other to form a plurality of current mirror structures. The second terminal of the transistor T1 is electrically coupled to a third terminal of the transistor T1, and the reference current source ISref is electrically coupled between the third terminal of the transistor T1 and a ground terminal GND.

The first terminal of the transistor T6 is electrically coupled to a third terminal of the transistor T2, the first terminal of the transistor T7 is electrically coupled to a third terminal of the transistor T3, the first terminal of the transistor T8 is electrically coupled to the third terminal of the transistor T4, the second terminals of the transistors T6, T7 and T8 are controlled by the processing circuit PC, and third terminals of the transistors T6, T7, T8 output the first current I1' under control of the processing circuit PC. A third terminal of the transistor T5 can be used to output the second current I2'. By switching the transistors T6, T7, T8 and adjusting size ratios of the transistors T1 to T4, the first current I1' to be output can be determined. However, the above descriptions are for exemplary purposes only, and should not be construed as limiting the present disclosure.

Beneficial Effects of the Embodiments

In conclusion, in the RC calibration method and the RC calibration circuit provided by the present disclosure, the first current source, the second current source, the adjustment magnification of the input clock and the adjusted charging number of times used for charging can be dynamically adjusted, or the to-be-calibrated resistor and/or to-be-calibrated capacitor can be adjusted, such that the RC calibration method and the RC calibration circuit provided by the present disclosure can be applied to circuits with clock signals different from an initial period used in the initial design that specifies the resistance-capacitance product, and there is no need to redesign the RC calibration circuit, such as to save hardware costs.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A resistor-capacitor (RC) calibration method, applicable to a to-be-calibrated resistor and a to-be-calibrated capacitor, and the RC calibration method comprising:

providing an RC calibration circuit including:

a first current source electrically coupled to the to-be-calibrated resistor through a first node;

a second current source electrically coupled to the to-be-calibrated capacitor through a second node;

a comparator circuit configured to compare a first voltage of the first node with a second voltage of the second node, and to generate a comparison signal according to a comparison result; and a processing circuit configured to receive an input clock signal and the comparison signal;

configuring the processing circuit to perform a calibration process according to a ratio of an input period of the input clock signal to an initial period, wherein the calibration process includes:

adjusting one or more of a first current of the first current source, a second current of the second current source, and an adjustment magnification of the input period according to the ratio to satisfy an equation for a specified resistance-capacitance product, or adjusting one or more of a resistance and a capacitance in the specified resistance-capacitance product according to the ratio, wherein the initial period is associated with the specified resistance-capacitance product;

configuring the processing circuit to control the second current source to charge the to-be-calibrated capacitor; and configuring the processing circuit to determine whether or not the comparison signal indicates that the first voltage and the second voltage meet a calibration completion condition, and if not, adjusting one or more of the to-be-calibrated resistor and the to-be-calibrated capacitor according to the comparison signal, and repeatedly controlling the second current source to charge the to-be-calibrated capacitor until the comparison signal indicates that the first voltage and the second voltage meet the calibration completion condition.

2. The RC calibration method according to claim 1, wherein the equation for the specified resistance-capacitance product is represented by the following equation (1):

$$RC = N * T * I2/I1; \qquad \text{equation (1)}$$

where RC in equation (1) is the specified resistance-capacitance product, N is an initial charging number of times corresponding to the initial period, T is the initial period, I1 is an initial first current of the first current source, and I2 is an initial second current of the second current source.

3. The RC calibration method according to claim 2, wherein the step of adjusting one or more of the first current, the second current, and the adjustment magnification to satisfy the equation for the specified resistance-capacitance product is performed based on the equation (1) and the following equation (2):

$$RC = N * T' * K * I2'/I1';$$ equation (2)

wherein, RC in equation (2) is the specified resistance-capacitance product, T' is the input period, I1' is the first current, I2' is the second current, and K is the adjustment magnification.

4. The RC calibration method according to claim 3, wherein the RC calibration circuit further includes:

a frequency divider configured to receive the input clock signal, wherein the frequency divider has a plurality of output terminals for outputting a plurality of frequency-divided signals; and a switch circuit being controlled to selectively select one of the plurality of frequency-divided signals to be input to the processing circuit.

5. The RC calibration method according to claim 4, further comprising:

in response to the adjustment magnification being adjusted according to the ratio, configuring the processing circuit to control the switch circuit to select one of the plurality of frequency-divided signals according to the adjustment magnification.

6. The RC calibration method according to claim 2, wherein the step of adjusting one or more of the first current, the second current, and the adjustment magnification to satisfy the equation for the specified resistance-capacitance product further includes: fixing the adjustment magnification and adjusting, according to equation (1) and the following equation (3), one or more of the first current, the second current, and an adjusted charging number of times corresponding to the input period to satisfy the equation for the specified resistance-capacitance product:

$$RC = N' * T' * K * I2'/I1';$$ equation (3)

wherein, RC in equation (3) is the specified resistance-capacitance product, N' is an adjusted charging number of times, T' is the input period, I1' is the first current, I2' is the second current, and K is the adjustment magnification.

7. The RC calibration method according to claim 6, wherein the processing circuit includes:

a counter configured to count the input clock signal to generate a count value; and a multiplier configured to receive the count value and an input value, and multiply the count value and the input value to obtain the adjusted charging number of times.

8. The RC calibration method according to claim 7, further comprising:

in response to the adjusted charging number of times being adjusted according to the ratio, configuring the processing circuit to determine the input value according to the adjusted charging times.

9. A resistor-capacitor (RC) calibration circuit, suitable for a to-be-calibrated resistor and a to-be-calibrated capacitor, and the RC calibration circuit comprising:

a first current source electrically coupled to the to-be-calibrated resistor through a first node;

a second current source electrically coupled to the to-be-calibrated capacitor through a second node;

a comparator circuit configured to compare a first voltage of the first node with a second voltage of the second node, and to generate a comparison signal according to a comparison result; and a processing circuit configured to receive an input clock signal and the comparison signal, wherein the processing circuit is configured to perform a calibration process, including:

adjusting, according to a ratio between an input period of the input clock signal and an initial period, one or more of a first current of the first current source, a second current of the second current source, and an adjustment magnification of the input period in order to satisfy an equation for a specified resistance-capacitance product, or adjusting one or more of a resistance and a capacitance in the specified resistance-capacitance product according to the ratio, wherein the initial period is associated with the specified resistance-capacitance product; and determining whether or not the comparison signal indicates that the first voltage and the second voltage meet a calibration completion condition, and if not, adjusting one or more of the to-be-calibrated resistor and the to-be-calibrated capacitor according to the comparison signal, and repeatedly controlling the second current source to charge the to-be-calibrated capacitor until the comparison signal indicates that the first voltage and the second voltage meet the calibration completion condition.

10. The RC calibration circuit according to claim 9, wherein the equation for the specified resistance-capacitance product is represented by the following equation (1):

$$RC = N * T * I2/I1;$$ equation (1)

wherein, RC in equation (1) is the specified resistance-capacitance product, N is an initial charging number of times corresponding to the initial period, T is the initial period, I1 is an initial first current of the first current source, and I2 is an initial second current of the second current source.

11. The RC calibration circuit according to claim 10, wherein the step of adjusting one or more of the first current, the second current, and the adjustment magnification to satisfy the equation for the specified resistance-capacitance product is performed based on the equation (1) and the following equation (2):

$$RC = N * T' * K * I2'/I1';$$ equation (2)

wherein, RC in equation (2) is the specified resistance-capacitance product, T' is the input period, I1' is the first current, I2' is the second current, and K is the adjustment magnification.

12. The RC calibration circuit according to claim 11, further comprising:

a frequency divider configured to receive the input clock signal, wherein the frequency divider has a plurality of output terminals for outputting a plurality of frequency-divided signals; and a switch circuit being controlled to selectively select one of the plurality of frequency-divided signals to be input to the processing circuit.

13. The RC calibration circuit according to claim 12, wherein, in response to the adjustment magnification being adjusted according to the ratio, the processing circuit is configured to control the switch circuit to select one of the plurality of frequency-divided signals according to the adjustment magnification.

14. The RC calibration circuit according to claim 10, wherein the step of adjusting one or more of the first current, the second current, and the adjustment magnification to satisfy the equation for the specified resistance-capacitance product further includes: fixing the adjustment magnification and adjusting, according to equation (1) and the following equation (3), one or more of the first current, the second current, and an adjusted charging number of times corresponding to the input period to meet the specified resistance-capacitance product:

$$RC = N' * T' * K * I2'/I1'; \qquad \text{equation (3)}$$

wherein, RC in equation (3) is the specified resistance-capacitance product, N' is an adjusted charging number of times, T' is the input period, I1' is the first current, I2' is the second current, and K is the adjustment magnification.

15. The RC calibration circuit according to claim 14, wherein the processing circuit includes:

a counter configured to count the input clock signal to generate a count value; and a multiplier configured to receive the count value and an input value, and multiply the count value and the input value to obtain the adjusted charging number of times.

16. The RC calibration circuit according to claim 15, wherein, in response to the adjusted charging number of times being adjusted according to the ratio, the processing circuit is configured to determine the input value according to the adjusted charging times.

\* \* \* \* \*